(12) United States Patent
Zhang et al.

(10) Patent No.: US 9,986,319 B2
(45) Date of Patent: May 29, 2018

(54) MEMS SENSOR

(71) Applicants: Rui Zhang, Shenzhen (CN); Ting Kang, Shenzhen (CN)

(72) Inventors: Rui Zhang, Shenzhen (CN); Ting Kang, Shenzhen (CN)

(73) Assignee: AAC ACOUSTIC TECHNOLOGIES (SHENZHEN) CO., LTD, Shenzhen (CN)

( * ) Notice: Subject to any disclaimer, the term of this patent is extended or adjusted under 35 U.S.C. 154(b) by 0 days. days.

(21) Appl. No.: 15/417,184

(22) Filed: Jan. 26, 2017

(65) Prior Publication Data
US 2018/0115810 A1   Apr. 26, 2018

(30) Foreign Application Priority Data

Oct. 25, 2016 (CN) ..................... 2016 2 1166313 U

(51) Int. Cl.
| | |
|---|---|
| *H04R 19/04* | (2006.01) |
| *H04R 1/02* | (2006.01) |
| *H04R 19/00* | (2006.01) |
| *H04R 1/22* | (2006.01) |
| *H04R 1/38* | (2006.01) |

(52) U.S. Cl.
CPC ............. *H04R 1/02* (2013.01); *H04R 1/222* (2013.01); *H04R 1/38* (2013.01); *H04R 19/005* (2013.01); *H04R 19/04* (2013.01); *B81B 2201/0257* (2013.01); *H04R 2201/003* (2013.01); *H04R 2499/11* (2013.01)

(58) Field of Classification Search
CPC ........ H04R 1/02; H04R 1/1041; H04R 1/222; H04R 19/005; H04R 19/04; H04R 23/006; H04R 2201/003; H04R 2499/11; B81B 3/0078; B81B 2201/0257
USPC ....... 381/113, 116, 313, 355, 356, 357, 360, 381/173, 174, 175, 373, 191; 257/415, 257/416
See application file for complete search history.

(56) References Cited

U.S. PATENT DOCUMENTS

| | | | | |
|---|---|---|---|---|
| 7,233,679 | B2 * | 6/2007 | Muthuswamy | ........ H04R 19/04 381/174 |
| 8,533,920 | B2 * | 9/2013 | Igarashi | ................ G06F 21/645 26/6 |
| 2013/0129119 | A1 * | 5/2013 | Miyatake | ............... H04R 19/04 381/176 |
| 2015/0078587 | A1 * | 3/2015 | Dehe | ..................... B81B 3/0078 381/114 |

* cited by examiner

*Primary Examiner* — Huyen D Le
(74) *Attorney, Agent, or Firm* — Na Xu; IPro, PLLC

(57) ABSTRACT

A MEMS sensor is disclosed. The MEMS sensor includes a housing having an acoustic port, a base plate forming an accommodation cavity together with the housing, a MEMS chip accommodated in the accommodation cavity, and a control mechanism having a first working position and a second working position. At the first working position, the acoustic port communicates the accommodation cavity with an external space of the housing, while at the second working position, the control mechanism isolates the accommodation cavity from the external space of the housing.

4 Claims, 5 Drawing Sheets

MEMS SENSOR

FIELD OF THE PRESENT DISCLOSURE

The present disclosure relates to the field of MEMS sensors, and more particularly to an acoustic-electro transducer.

DESCRIPTION OF RELATED ART

A microphone mainly comprises a housing and a MEMS chip which is accommodated in the housing. An acoustic port is formed in the housing, and the air (sound waves) from an external environment could enter the housing via the acoustic port, so that a diaphragm in the MEMS chip is activated to vibrate.

However, when an atmosphere pressure in an external environment is abnormal, the diaphragm on the MEMS chip is very vulnerable, so that a service life of the microphone is shorter.

Thereof, it is necessary to disclose and provide an improved MEMS microphone to overcome the above-mentioned disadvantage.

BRIEF DESCRIPTION OF THE DRAWING

Many aspects of the exemplary embodiments can be better understood with reference to the following drawing. The components in the drawing are not necessarily drawn to scale, the emphasis instead being placed upon clearly illustrating the principles of the present disclosure.

In FIGS. 1, 4, and 7, the arrows indicate the directions of the air pressure.

DETAILED DESCRIPTION OF THE EXEMPLARY EMBODIMENTS

Figure 1:
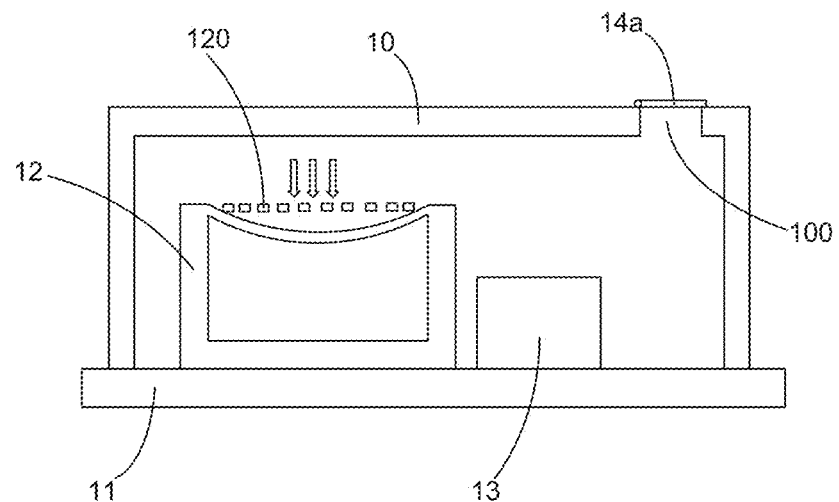
FIG. 1 is a cross-sectional view of a MEMS sensor in accordance with a first embodiment of the present disclosure.

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby are only to explain the disclosure, not intended to limit the disclosure.

As shown in FIGS. 1-10, a MEMS sensor comprises a housing 10, a base plate 11, a MEMS chip 12, a control circuit chip 13 and a control mechanism. The control panel 14 can be an elastic steel piece.

The housing 10 and the base plate 11 cooperatively form an accommodation cavity. The MEMS chip 12 is accommodated in the accommodation cavity, and is specifically mounted on the base plate 11. The MEMS chip 12 has a diaphragm 120, and the diaphragm 120 can be deformed by external forces, such as air pressure or sound wave for outputting electrical signals. Similarly, the control circuit chip 13 is also accommodated in the accommodation cavity in the housing 10, and it can also be installed on the base plate 11 directly. The control mechanism may be a control mechanism 14a shown in FIGS. 1-3 or a control mechanism 14b shown in FIGS. 4-6. In addition, the control mechanism may also comprise a first control mechanism 14ca and a second control mechanism 14cb shown in FIGS. 7-10.

An acoustic port 100 is formed in the housing 10, and the control mechanism has a first working position and a second working position. At the first working position, the control mechanism 14 is in an open status, and the accommodation cavity in the housing 10 is communicated with an external space via the acoustic port 100; at the second working position, the control mechanism 14 is in a closed status, and the control mechanism isolates the accommodation cavity in the housing 10 from the external space. When the control mechanism 14 is at the open status, the sensor is at a working state. When the control mechanism 14 is at the closed status, the sensor is at a non-working state.

Therefore, by virtue of the configuration mentioned above, the MEMS sensor can be controlled by the control mechanism 12 between the working state and the non-working state, so that the MEMS chip 12 could be protected when an ambient pressure of the environment becomes abnormal, which prevents the MEMS sensor 12 from being damaged due to the external environment, and service life of the sensor is extended.

Optionally, the control mechanism comprises a control panel, and the control panel covers the acoustic port 100. Specifically, the control panel can be set at external side of the acoustic port 100, or internal side of the acoustic port 100. Certainly, it can be also embedded in the acoustic port 100. Alternatively, the control mechanism 14 may comprise a drive part, and the drive part can drive the control panel to move directly, in order to switch the states of the sensor.

Figure 2:
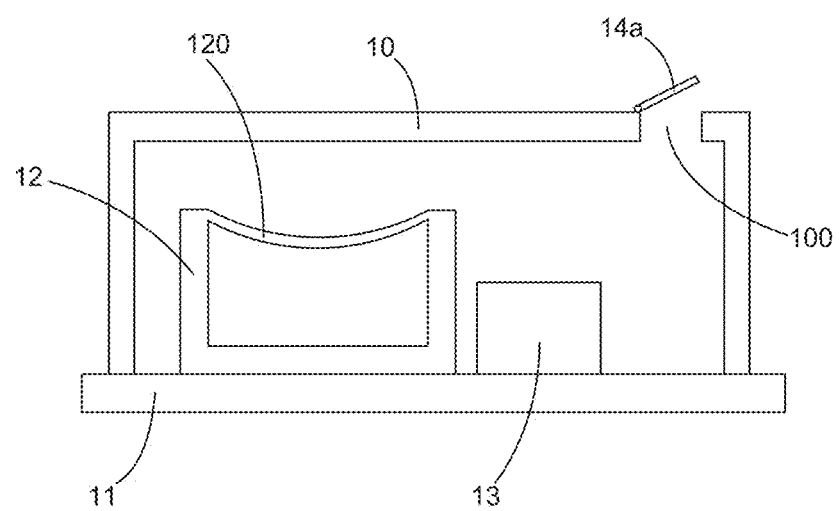
FIG. 2 is a cross-sectional view of the MEMS sensor in FIG. 1, at a first state.
Figure 3:
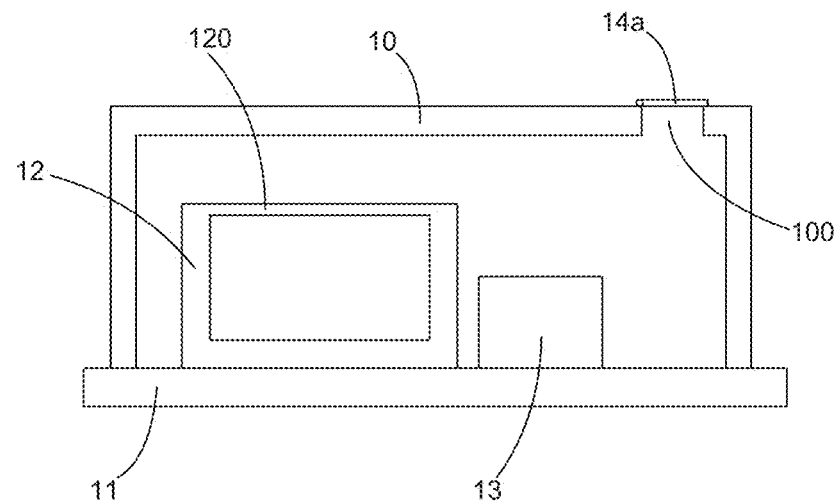
FIG. 3 is a cross-sectional view of the MEMS sensor in FIG. 1, at a second state.

Referring to FIGS. 1-3, the control mechanism 14a is set on an external surface of the housing 10. The control mechanism 14a can switch its states automatically by external atmosphere pressure. Specifically, the control mechanism 14a covers the acoustic port 100. As shown in FIG. 2, when the atmosphere pressure of the external space is in the normal scope, the control mechanism 14a is in the opening state, and the MEMS chip 12 can be deformed normally. As shown in FIG. 3, when the atmosphere pressure exceeds the scope of the normal atmosphere pressure, the control mechanism 14a is switched to the closed state in order to protect the MEMS chip 12.

Figure 4:
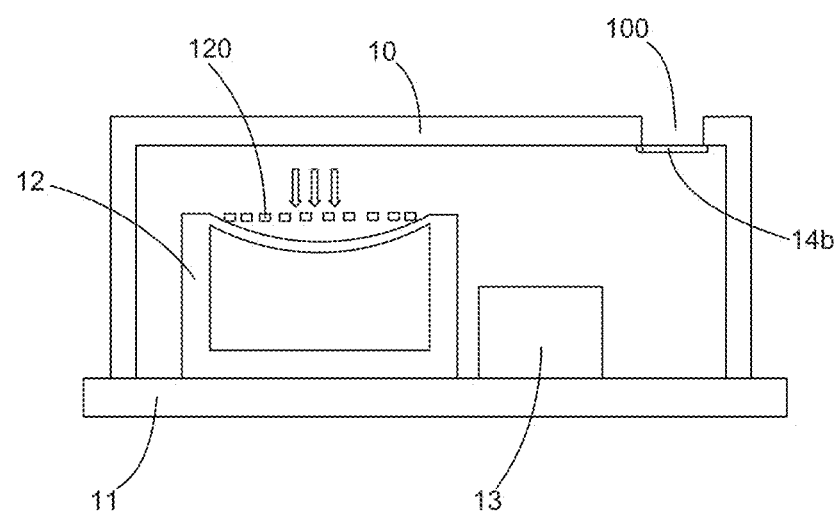
FIG. 4 is a cross-sectional view of a MEMS sensor in accordance with a second embodiment of the present disclosure.
Figure 5:
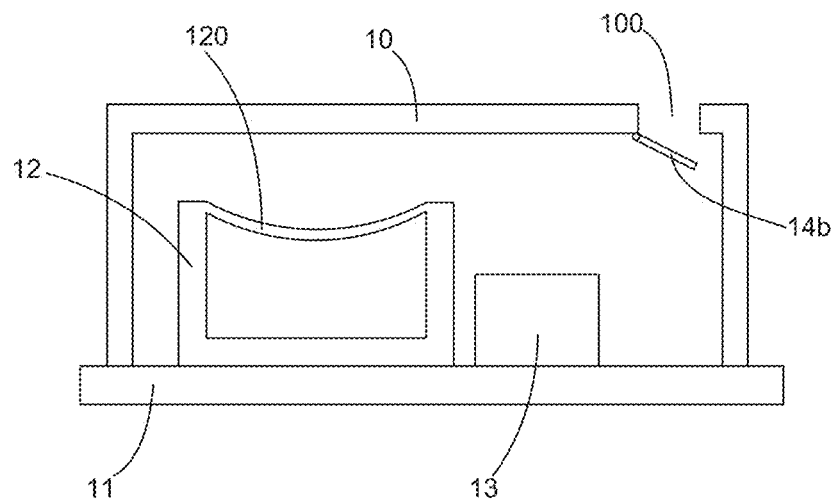
FIG. 5 is a cross-sectional view of the MEMS sensor in FIG. 4, at a first state.
Figure 6:
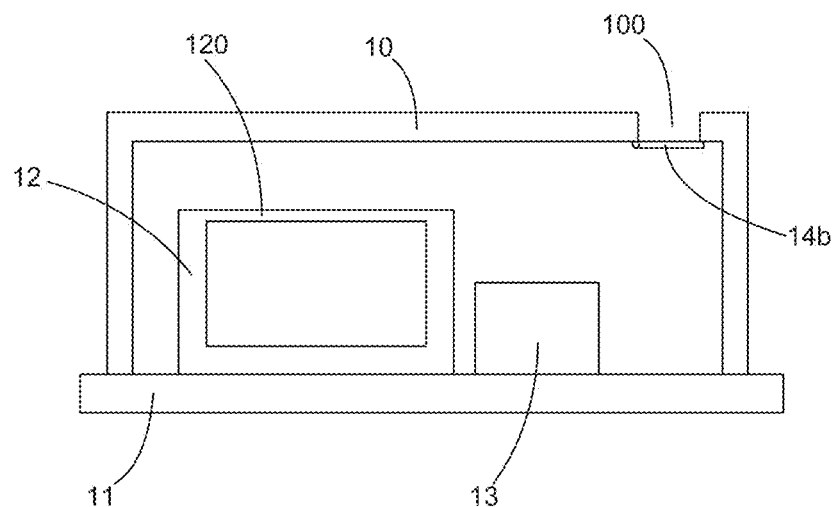
FIG. 6 is a cross-sectional view of the MEMS sensor in FIG. 4, at a second state.
Figure 7:
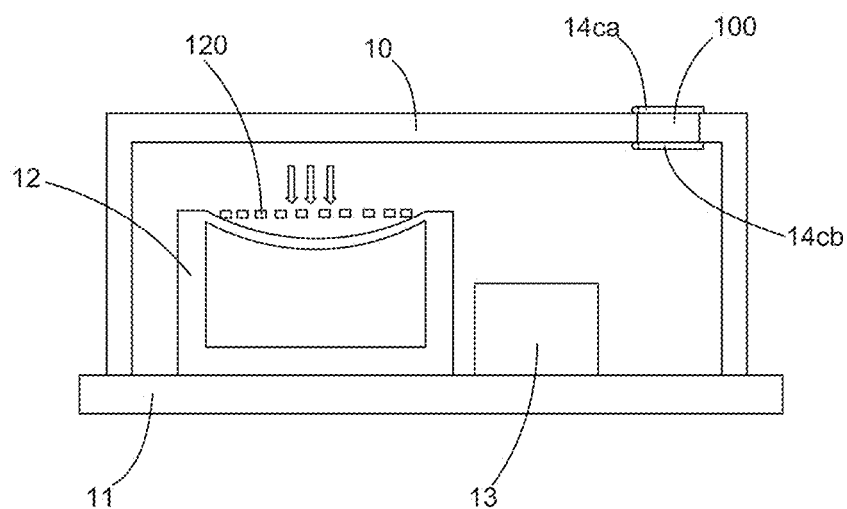
FIG. 7 is a cross-sectional view of a MEMS sensor in accordance with a third embodiment of the present disclosure.

Referring to FIGS. 4-6, the control mechanism 14b is disposed on an internal surface of the housing 10. The control mechanism 14b is in the accommodation cavity in the housing 10, i.e. the control mechanism 14 doesn't occupy any external space of the housing 10, in order to make the whole microphone smaller. Specifically, the control mechanism 14b covers the acoustic port 100. As shown in FIG. 4, when atmosphere of external space is in normal scope of the atmosphere pressure, the control mechanism 14b is in the closed state, and the MEMS chip 12 is at the non-working state. As shown in FIG. 5, when the atmosphere pressure of the external space increases to the scope of high pressure required, the control mechanism 14b is switched to opening state under an action of the atmosphere pressure of the external space, and the MEMS chip 12 starts working.

Figure 8:
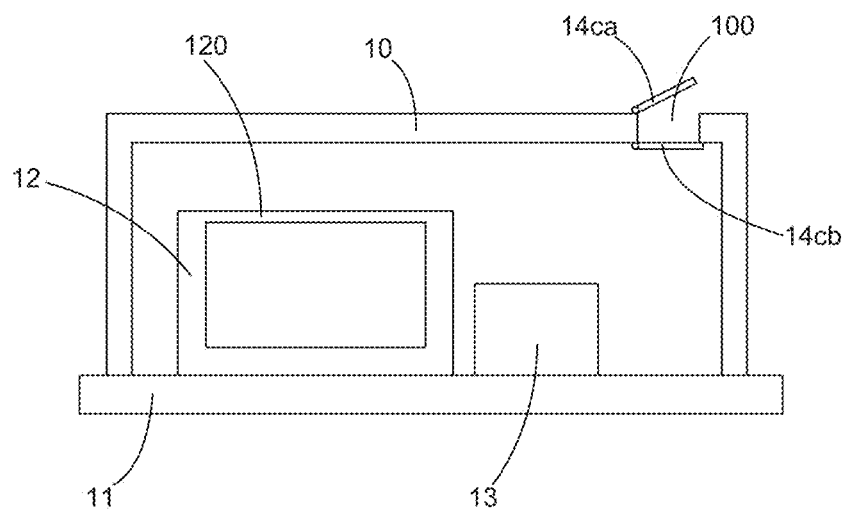
FIG. 8 is a cross-sectional view of the MEMS sensor in FIG. 7, at a first state.
Figure 9:
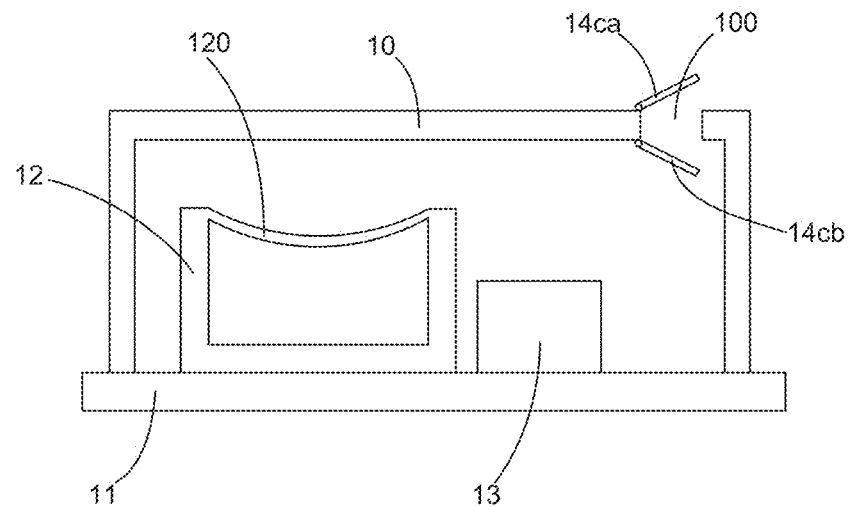
FIG. 9 is a cross-sectional view of the MEMS sensor in FIG. 7, at a second state.
Figure 10:
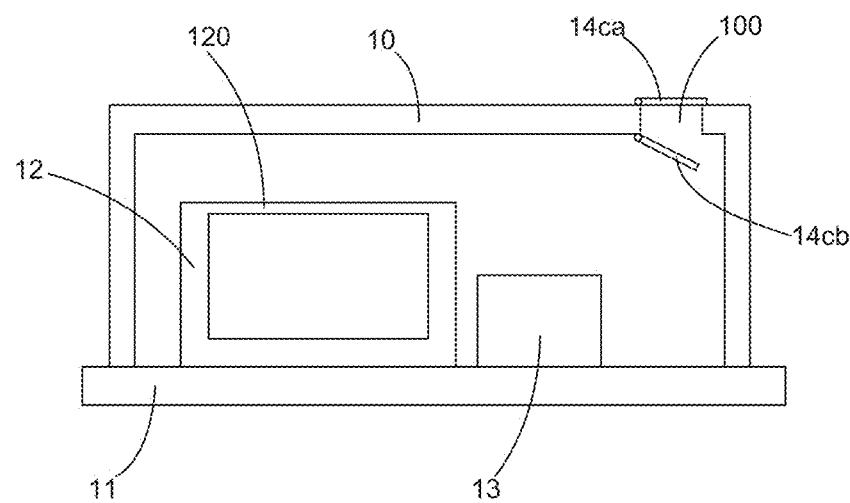
FIG. 10 is a cross-sectional view of the MEMS sensor in FIG. 7, at a third state.

Referring to FIGS. 7-10, the control mechanism comprises the first control mechanism 14ca disposed on the external surface of the housing 10 and the second control mechanism 4cb disposed on internal surface of the housing 10. As shown in FIG. 8, the first control mechanism 14ca can be at the opening state, and the second control mechanism 14cb can be at the closed state so that the MEMS chip 12 is not working. As shown in FIG. 9, when the atmosphere pressure of the external space increases to the scope of high pressure required, the second control mechanism 14cb is switched to the opening state, and the MEMS chip 12 is working. As shown in FIG. 10, when the atmosphere pressure of the external space increases into abnormal scope of atmosphere pressure, the first control mechanism 14ca is switched to the closed state under an action of the atmosphere pressure of the external space, and the MEMS chip 12 stops working.

Alternatively, when it is at normal atmosphere pressure, under initial state, the first control mechanism 14ca can be at the closed state, and the second control mechanism 14cb can be at the opening state, and the MEMS chip 12 is not working; when atmosphere pressure of external space decreases to the scope of low pressure required, the first control mechanism 14ca is switched to opening state, and the MEMS chip 12 is working. When the atmosphere pressure of the external space decreases into abnormal scope of atmosphere pressure, the second control mechanism 14cb is switched to the closed state under an action of the atmosphere pressure of the external space, and the MEMS chip 12 stops working.

Various setting ways of the control mechanism can be selected flexibly by definite application scenario and demand.

For above three ways, in order to guarantee the stability of the atmosphere pressure, the following structure can be used: the first control mechanism 14ca comprises a first control panel, and the second control mechanism 14cb comprises a second control panel, and the first control panel and the second control panel are rotated and connected to the housing 10, and both the connection between the first control panel and the housing 10 and the connection between the second control panel and the housing 10 are at the same side of the acoustic port 100. The same side here refers to the fact that above two connections are set opposite to each other along axial direction of the acoustic port 100. When the air is passing through the acoustic port 100, the air flow direction will not change too much, in order to achieve above purpose.

Further, both the connection between the first control panel and the housing 10 and the connection between the second control panel and the housing 10 are at the same side on the acoustic port 100 near the MEMS chip 12, in order to extend the stroke where the air is applied on the MEMS chip 12, in order to prevent the unstable air from being applied on the MEMS chip 12. Therefore, further technological scheme can improve the working precision of the MEMS chip 12.

In order to optimize the performance of above first control panel and second control panel, at least one of them can be set as a rigid elastic piece, and the rigid elastic piece can switch its own state by change of air pressure.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS sensor, comprising:
a housing having an acoustic port;
a base plate forming an accommodation cavity together with the housing;
a MEMS chip accommodated in the accommodation cavity;
a control mechanism having a first working position and a second working position; wherein
at the first working position, the acoustic port communicates the accommodation cavity with an external space of the housing, while at the second working position, the control mechanism isolates the accommodation cavity from the external space of the housing;
the control mechanism comprising a first control mechanism disposed on an external surface of the housing and a second control mechanism disposed on an internal surface of the housing; the first control mechanism comprising a first control panel, and the second control mechanism comprising a second control panel, both the first control panel and the second control panel rotatably connected to the housing, and both a position where the first control panel is connected to the housing and a position where the second control panel is connected to the housing being at the same side of the acoustic port.

2. The MEMS sensor as described in claim 1, wherein both a position where the first control panel is connected to the housing and a position where the second control panel is connected to the housing are at the same side of the acoustic port near the MEMS chip.

3. The MEMS sensor as described in claim 1, wherein at least one of the first control panel and the second control panel is a rigid elastic piece.

4. The MEMS sensor as described in claim 1, wherein the MEMS chip is a pressure sensor.

* * * * *